United States Patent
Wand et al.

(10) Patent No.: US 11,089,706 B2
(45) Date of Patent: Aug. 10, 2021

(54) OVERHEAD DISPLAY ASSEMBLY AND METHOD FOR ELECTRONIC GAMING MACHINES

(71) Applicant: Aristocrat Technologies Australia Pty Limited, North Ryde (AU)

(72) Inventors: Robert Wand, Elgin, IL (US); Frank Rodriguez, Chicago, IL (US); Timothy Seckel, Streamwood, IL (US)

(73) Assignee: Aristocrat Technologies Australia Pty Limited

(*) Notice: Subject to any disclaimer, the term of this patent is extended or adjusted under 35 U.S.C. 154(b) by 0 days.

(21) Appl. No.: 16/677,311

(22) Filed: Nov. 7, 2019

(65) Prior Publication Data

US 2020/0077529 A1 Mar. 5, 2020

Related U.S. Application Data

(62) Division of application No. 15/952,757, filed on Apr. 13, 2018, now Pat. No. 10,506,730.

(51) Int. Cl.
*H05K 5/02* (2006.01)
*G07F 17/32* (2006.01)
*H05K 5/00* (2006.01)

(52) U.S. Cl.
CPC ....... *H05K 5/0234* (2013.01); *G07F 17/3211* (2013.01); *H05K 5/0017* (2013.01)

(58) Field of Classification Search
CPC . H05K 5/0234; H05K 5/0017; G07F 17/3211
See application file for complete search history.

(56) References Cited

U.S. PATENT DOCUMENTS

| | | | | |
|---|---|---|---|---|
| 6,484,993 B2* | 11/2002 | Huffman | ............... | F16M 11/046 |
| | | | | 248/323 |
| 6,931,795 B1* | 8/2005 | Baloga | ................... | A47B 21/00 |
| | | | | 52/220.7 |
| 7,395,996 B2* | 7/2008 | Dittmer | .................. | F16M 11/10 |
| | | | | 248/291.1 |

(Continued)

OTHER PUBLICATIONS https://gaming.itsgames.com/cabinets/simple-sign.
https://itsgames.s3.amazonaws.com/production/gaming/documents/cabinets/skybox/Skybox_Configuration_setups.pdf.
https://gaming.itsgames.com/cabinets/infinity-super-skybox.

*Primary Examiner* — Rochshana D Chowdhury
*Assistant Examiner* — Douglas R Burtner
(74) *Attorney, Agent, or Firm* — McAndrews, Held & Malloy, Ltd.

(57) ABSTRACT

A system and method for an overhead display assembly for positioning a display monitor above an electronic gaming machine are provided. The overhead display assembly may include a monitor frame securable to a display monitor, the monitor frame including at least one roller mechanism that is pivotally coupled to the monitor frame. The overhead display assembly may also include a support stanchion configured to extend vertically relative to a gaming machine, the support stanchion including an upper end that is vertically displaced above the electronic gaming machine. Finally, the overhead display assembly may include a track mechanism coupled to an upper end of the support stanchion and presenting a track portion configured to engage with the roller mechanism to support the display monitor and the monitor frame.

3 Claims, 12 Drawing Sheets

(56) References Cited

U.S. PATENT DOCUMENTS

| | | | | |
|---|---|---|---|---|
| 8,596,599 | B1* | 12/2013 | Carson | F16M 11/041 248/429 |
| 9,679,435 | B2 | 6/2017 | Schrementi et al. | |
| 9,659,434 | B2 | 12/2017 | Bainbridge et al. | |
| 2004/0178312 | A1* | 9/2004 | Parsons | A61B 90/30 248/276.1 |
| 2008/0123265 | A1* | 5/2008 | Ohlinger | F16M 11/10 361/679.06 |
| 2009/0124395 | A1* | 5/2009 | O'Keene | G07F 17/32 463/46 |
| 2009/0253499 | A1 | 10/2009 | Nagano | |
| 2010/0059640 | A1* | 3/2010 | Helgesen | A47B 81/062 248/205.1 |
| 2011/0009189 | A1 | 1/2011 | Jordan et al. | |
| 2011/0275443 | A1* | 11/2011 | Cole | G07F 17/3216 463/46 |
| 2012/0220363 | A1* | 8/2012 | Bytnar | G07F 17/3213 463/25 |
| 2013/0310172 | A1* | 11/2013 | Joko | G07F 17/3211 463/31 |
| 2013/0310173 | A1* | 11/2013 | Joko | A63F 13/25 463/31 |
| 2013/0324246 | A1* | 12/2013 | Ishimaru | G07F 17/3211 463/31 |
| 2016/0037924 | A1* | 2/2016 | Bromley | F16M 11/10 211/26 |
| 2017/0249800 | A1 | 5/2017 | Schrementi et al. | |
| 2018/0081391 | A1* | 3/2018 | Mittler | G07F 17/3211 |
| 2018/0190068 | A1* | 7/2018 | Priddy | G07F 17/3211 |
| 2019/0039867 | A1* | 2/2019 | Urban | F16M 11/26 |
| 2019/0102983 | A1* | 4/2019 | Gallagher | G07F 17/3216 |
| 2019/0197824 | A1* | 6/2019 | Timperley | G07F 17/3227 |
| 2019/0320543 | A1* | 10/2019 | Wand | G07F 17/3211 |
| 2020/0331142 | A1* | 10/2020 | Vangal Ramamurthy | B25J 9/0009 |

* cited by examiner

OVERHEAD DISPLAY ASSEMBLY AND METHOD FOR ELECTRONIC GAMING MACHINES

RELATED APPLICATIONS

This application is a divisional of U.S. patent application Ser. No. 15/952,757, filed on Apr. 13, 2018, all content of which is herein incorporated by reference in its entirety.

FIELD

The present disclosure relates to an assembly, system and method for a gaming machine display, and, particularly, relates to an assembly, system and method for a gaming machine display that allows for enhanced installation and servicing of overhead display units.

BACKGROUND

Traditional electronic gaming machines (EGMs) typically include a cabinet that carries one or more displays. Additionally, other displays, which are not an integral part of the EGM, may also be associated with the EGM and be located proximate the EGM. For example, in some instances one or more overhead displays may be positioned above one or more EGMs and may be fixed in some fashion above the EGM to allow for the display of graphics or other information in connection with operation of the EGM and related systems.

Such overhead displays may be positioned relatively high above gaming floor making it difficult for maintenance personnel to access, install and/or service heavy overhead displays without use of step ladders, scaffolding or other elevating devices. Likewise, replacing and/or installing such overhead displays may require installers and maintenance technicians to specially lift or hoist one or more monitors, which may weigh in excess of fifty pounds, above the EGM (and the level of the installer's or technician's head) to properly position the monitor in its mounted position. This may present a dangerous situation. Such configurations may be further confined by walls and other equipment adding to the difficulty in the installation, service and other access to these overhead displays. Moreover, such overhead displays may be affixed to the EGM in such way to require multiple tools and added labor to assemble, which may also take the EGMs out of service for game play and overall revenue generation.

Some overhead displays are merely hung over the EGM. This reduced constraint of the overhead display may allow the overhead display to be lifted out or fall, which adds risks to technicians and patrons alike.

The challenges with positioning the overhead displays and related assembly for installation, replacement and service may result in additional personnel and/or equipment being needed to support the monitor during its installation and/or maintenance. This may alter levels of acceptable safety surrounding installation, replacement and service of overhead display and also add labor and other costs.

SUMMARY

Some embodiments of the present disclosure relate to an overhead display assembly for positioning a display monitor above an electronic gaming machine. The overhead display assembly may include a monitor frame securable to a display monitor. The monitor frame may include at least one roller mechanism that may be pivotally coupled to the monitor frame. A support stanchion may be configured to extend vertically relative to a gaming machine. The support stanchion may include an upper end that is vertically displaced above the electronic gaming machine. A track mechanism may be coupled to an upper end of the support stanchion and presenting a track portion configured to engage with the roller mechanism to support the display monitor and the monitor frame.

According to certain aspects, the track mechanism may be movably connected the support stanchion for movement between an operational position and a maintenance position displaced from the operational position. In some embodiments the track mechanism may be pivotally coupled to the upper end of the stanchion. Moreover, the upper end of the support stanchion may be vertically adjustable with respect to the lower end and the base.

The overhead display assembly may further include a base connected to a lower end of the support stanchion. The base may be configured to receive the electronic gaming machine and/or a pedestal upon which the gaming machine may be positioned. Additionally, in some embodiments, the track portion may be horizontally offset from the support stanchion and may be configured to receive the at least one roller mechanism. The track portion may include a first and second opposed ends and further include first and second stop mechanisms positioned proximate to the first and second ends of the track portion, respectively. In some aspects the movement of the at least one roller mechanism within the track portion is limited by the first and second stop mechanisms. In some embodiments, track mechanism may be height adjustable relative to the upper end of the stanchion.

In some embodiments, while in the operational position, movement of the display monitor and monitor frame may be prevented by a locking member. Furthermore, while in the maintenance position, the locking member may be removed allowing the track portion, the display monitor, and the monitor frame collectively to rotate about the upper end of the support stanchion. In other embodiments, the at least one roller mechanism may be vertically adjustable with respect to the monitor frame.

In some aspects of the present disclosure, the at least one roller mechanism may include a first roller mechanism proximate a first side of the monitor frame and a second roller mechanism proximate a second side of the monitor frame. In such an embodiment, either the first roller mechanism or the second roller mechanism, when engaged with the track portion, may support the weight of the display monitor and monitor frame.

Some embodiments of the present disclosure relate to an electronic gaming machine bank or island. The electronic gaming machine bank or island may include a plurality of electronic gaming machines; a plurality of overhead display mount assemblies coinciding to the plurality of electronic gaming machines. Each of the plurality of overhead display mount assemblies may include a monitor frame securable to a display monitor. The monitor frame may include at least one roller mechanism that is pivotally coupled to the monitor frame. Each of the plurality of overhead display mount assemblies may further include a support stanchion configured to extend vertically relative to a gaming machine. The support stanchion may include an upper end that is vertically displaced above the electronic gaming machine. Each of the plurality of overhead display mount assemblies may also include a track mechanism coupled to an upper end of the support stanchion and presenting a track portion configured engage with the roller mechanism to support the display monitor and the monitor frame, wherein the track portion that is horizontally offset from the support stanchion.

In some embodiments, at least one of the plurality of the track mechanisms of the overhead display mount assemblies may include a coupling portion that is pivotally coupled to the upper end of the support stanchion for movement between an operational position and a maintenance position displaced from the operational position. In other embodiments, at least each of the left-most and right-most track mechanisms of the plurality of overhead display mount assemblies may include a coupling portion that are pivotally coupled to the upper end of the support stanchion.

In some embodiments each of the plurality of the overhead display mount assemblies further include a base connected to a lower end of the support stanchion, the base may be configured to receive the electronic gaming machine and/or a pedestal upon which the gaming machine may be positioned. In other embodiments, the track portion of each of the plurality of overhead display mount assemblies may align to form a track assembly allowing each of the display monitors of the plurality of overhead display mount assemblies to be inserted magazine style by rolling the plurality of display monitors along the track assembly via the at least one roller mechanism from a first end of the track assembly to a second end of the track assembly. In further embodiments, each of the at least one roller mechanism may be vertically adjustable with respect to the monitor frame.

In some embodiments, each of the at least one roller mechanism may include a first roller mechanism proximate a first side of the monitor frame and a second roller mechanism proximate a second side of the monitor frame; and wherein either of the first roller mechanism or the second roller mechanism, when engaged with the track portion, may support the weight of the display monitor and monitor frame.

Some embodiments of the present disclosure relate to a method of assembling an overhead display assembly for an electronic gaming machine wherein the overhead display assembly may include a monitor frame securable to a display monitor, the monitor frame including at least one roller mechanism that is pivotally coupled to the monitor frame. The method may include assembling a base assembly, which may include affixing a pedestal of an electronic gaming machine to a base; and affixing a support stanchion to the base, the support stanchion comprising a lower and an upper end, the base configured to couple to the pedestal. The method may also include positioning the base assembly in a desired location. The method may further include assembling a track assembly, which may include coupling a track mechanism to the upper end of the support stanchion; and aligning the track mechanism. The method may also include mounting a display monitor, which may include engaging the display monitor via the at least one roller mechanism to the track assembly; and locking the display monitor the support stanchion with a locking member.

In some embodiments, the method may further include aligning a plurality of a plurality of display monitors by vertically adjusting the upper end of each support stanchion and vertically adjusting the at least one roller mechanism of each monitor frame. In further embodiments, the overhead display assembly may include at least three gaming machines and at least three display monitors comprising a left-most support stanchion, a right-most support stanchion, and at least one central support stanchion, and in which the track mechanism coupled to the left-most support stanchion may be pivotally coupled to the left-most support stanchion; and the track mechanism coupled to the right-most support stanchion may be pivotally coupled to the right-most support stanchion; the method may further include rotating at least one of the track mechanisms of either the left-most support stanchion or the right-most support stanchion to gain access to the track mechanism of the at least one central support stanchion.

BRIEF DESCRIPTION OF THE DRAWINGS

FIG. 1 is a front elevation view of an overhead display assembly in combination with an electronic machine that consists of a plurality of EGMs.

FIG. 2 is front perspective view of the overhead display assembly and electronic machine of FIG. 1.

FIG. 3 is a right side elevation view of the overhead display assembly and electronic machine of FIG. 1.

FIG. 4 is a top plan view of the overhead display assembly and electronic machine of FIG. 1.

FIG. 5 is a front perspective view of a mounting assembly of the overhead display assembly of FIG. 1.

FIG. 6 is a rear elevation view of the mounting assembly of FIG. 5, shown in connection with a plurality display monitors.

FIG. 7 is a rear perspective close-up view of a track mechanism and roller mechanism of the mounting assembly of FIG. 5.

FIG. 8 is a left-side elevation close-up view of the track mechanism and roller mechanism of FIG. 7.

FIG. 9 is a perspective view of an example track mechanism.

FIG. 10 is a partial top plan view of the right-most side of an overhead display assembly showing the right-most display monitor in a maintenance position and one of the central display monitors in a maintenance position.

FIG. 11 is a front perspective view of an overhead display assembly showing the right-most display monitor in a maintenance position, the adjacent central display monitor in a maintenance position, and another central display monitor in an operational position.

FIG. 12 is a flowchart of a method of assembling an overhead display assembly for an electronic machine wherein the overhead display assembly includes a display monitors, the display monitor being affixed to a monitor frame, and the monitor frame comprising at least one roller mechanism, wherein the at least one roller mechanism is pivotally coupled to the monitor frame.

Figure 1:
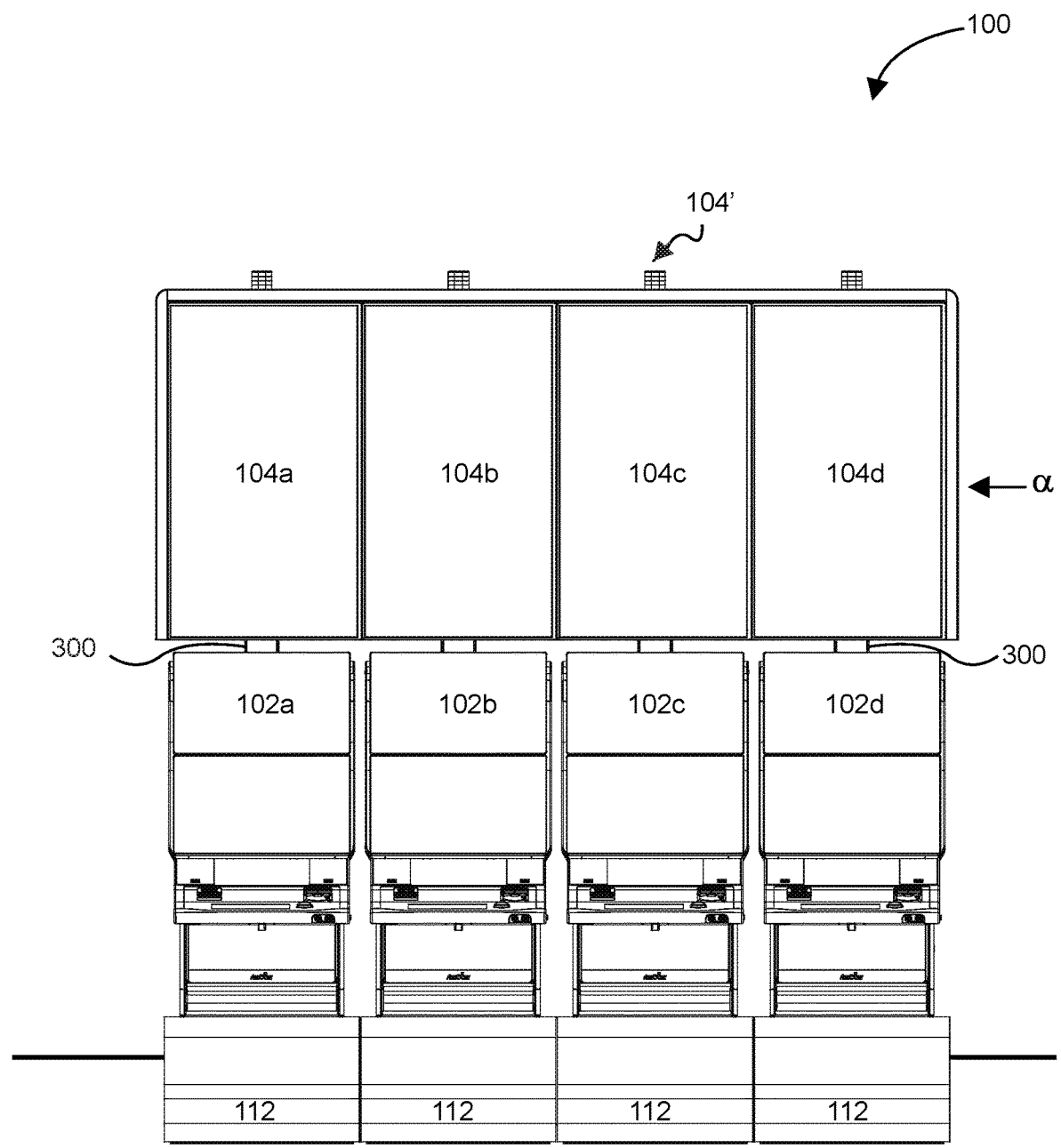
FIGS. 1-12 show an overhead display assembly in accordance with certain embodiments of the present disclosure.

Although specific features of various embodiments may be shown in some drawings and not in others, this is for convenience only. Any feature of any drawing may be referenced and/or claimed in combination with any feature of any other drawing.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein

DETAILED DESCRIPTION

The following detailed description illustrates embodiments of the disclosure by way of example and not by way of limitation. It is contemplated that the disclosure has general application to physical and methodical embodiments of an overhead display assembly in industrial, commercial, and residential applications.

Embodiments of an overhead display assembly including track and roller mechanisms are described herein. The track and roller mechanisms enable improved servicing of displays or monitors positioned over an EGM by allowing each monitor to ride freely on a track mechanism and enabling one or more display monitors to rotate out of the way from the EGMs to install, replace, or service the display monitors.

Such embodiments enable cost effective manufacture of an overhead display assembly, and reduce labor and other costs in installation, service and/or monitor replacement. The present disclosure also provides for a safer installation and servicing, for both for service technicians and for casino patrons. Finally, the present disclosure may be advantageous over existing designs because embodiments of the track and roller mechanisms allow access to the displays from the front of an electronic gaming machine when the sides are blocked by walls and/or other equipment.

The following description refers to the accompanying drawings, in which, in the absence of a contrary representation, the same numbers in different drawings represent similar elements.

FIGS. 1-4 illustrate an overhead display assembly 100 for an electronic gaming machine (EGM) 102 in accordance with certain aspects of an embodiment of the present disclosure. In the example embodiment, the electronic gaming machine 102 is in the form of a plurality (four shown) of electronic gaming machines (EGMs) 102a-102d ganged together in a bank or an island formation, sometimes referred to as a gaming machine island. The EGMs 102 may be the type at which players play games with game play media, and which pay out awards, such as credits or other prizes to players in accordance to game outcomes. In various embodiments, electronic machine 101 may be a single stand-alone EGM 102 or may have any number of EGMs 102 associated with each other by proximity whether in an island formation or not.

Overhead display assembly 100 may include a plurality of display monitors 104. In some instances, each display monitor 104 may be associated with a respective one of a plurality of EGMs 102. The plurality of display monitors 104, may also be associated with one or more related systems such as a progressive controller or sign(s) (not shown). The display monitors 104 may also be controlled (e.g., by one or more of the EGMs 1-4 or related systems) to form a single display monitor 104' that is associated with one or more of the EGMs 102. As is shown in FIGS. 1-4, the plurality of display monitors 104 may be positioned above the plurality of EGMs 102 in an operational position α, facing the same direction as the EGM 102. The operation position α may also allow the display monitor 104, to be turned on and be associated with a respective one or more EGM 102. Other configurations of display monitors 104 are also possible. For example, certain embodiments may contain as few as one display monitor 104. Other embodiments may contain any other number of display monitors 104. Moreover, other display monitor 104 arrangements are possible. For example, the one or more display monitors 104 may be arranged in a circular, triangular, square, hexagonal, octagonal, or other arrangement.

In some embodiments the display monitor 104 may be securable to a monitor frame 106 by affixing the display monitor 104 to the monitor frame 106. The terms "affix," "affixed," or "affixing" may refer to being fastened, attached, or secured to prevent movement between the part being affixed and the object to which the part is affixed. This may be done using conventional fasteners such as screws, bolts, nuts, or otherwise to secure one or more parts. Alternatively, affixed may mean being secured by means of an adhesive. Overhead display assembly 100 is configurable in several different arrangements.

Figure 5:
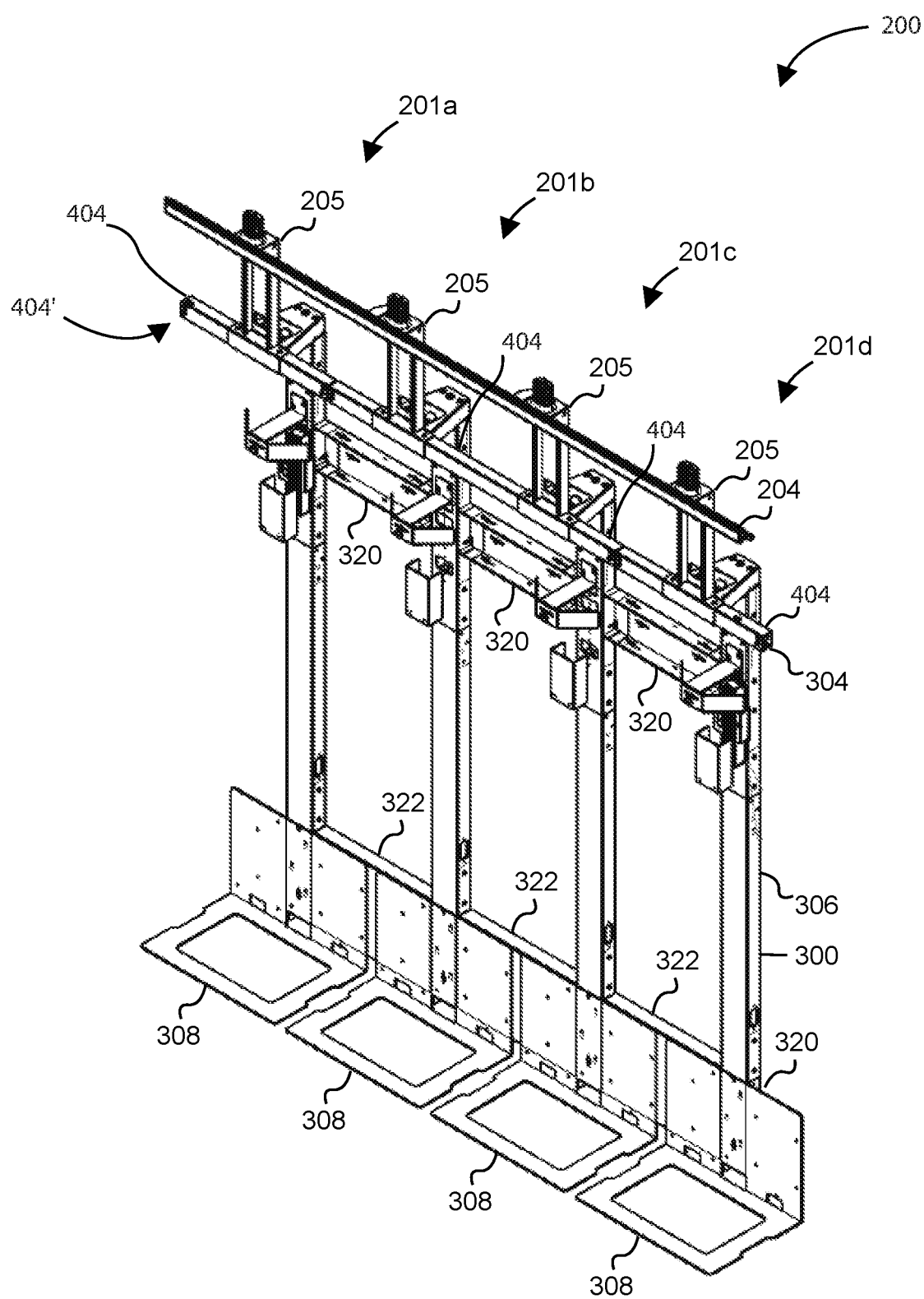
Figure 6:
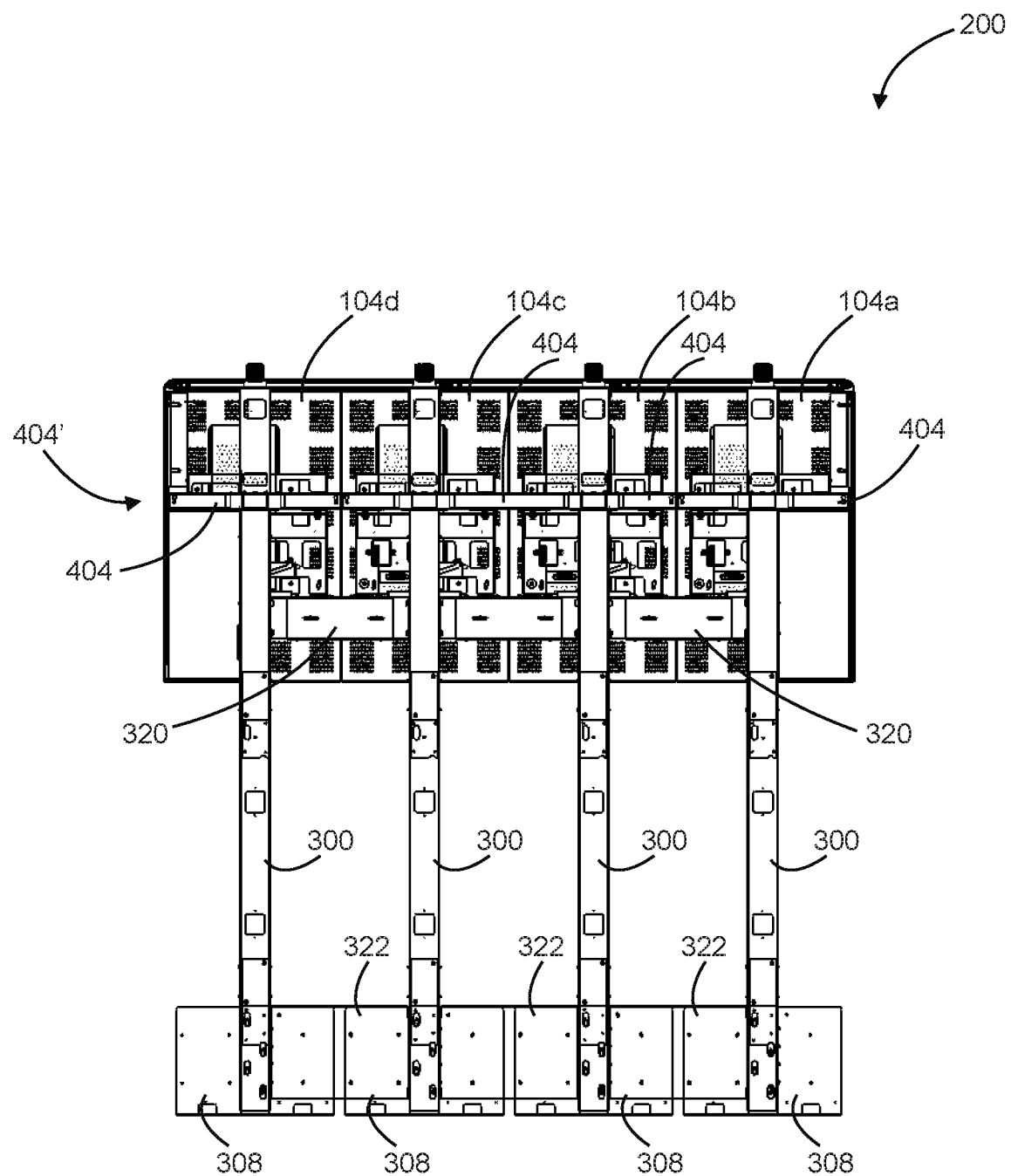

As is shown in FIGS. 5-6, the overhead display assembly 100 may also include a mounting assembly 200 configured to support the display monitors 104 above the EGMs 102. In the illustrated embodiment, the mounting assembly 200 includes a plurality of support frames 201 that may be interconnected to form the composite mounting assembly 200. Specifically, according to at least some embodiments the mounting assembly 200 includes respective support frames 201 for each respective EGM/display monitor combination. Accordingly, in the illustrated embodiment, the mounting assembly 200 includes four support frames 201 (shown as 201a, b, c, and d in FIG. 5).

Figure 4:
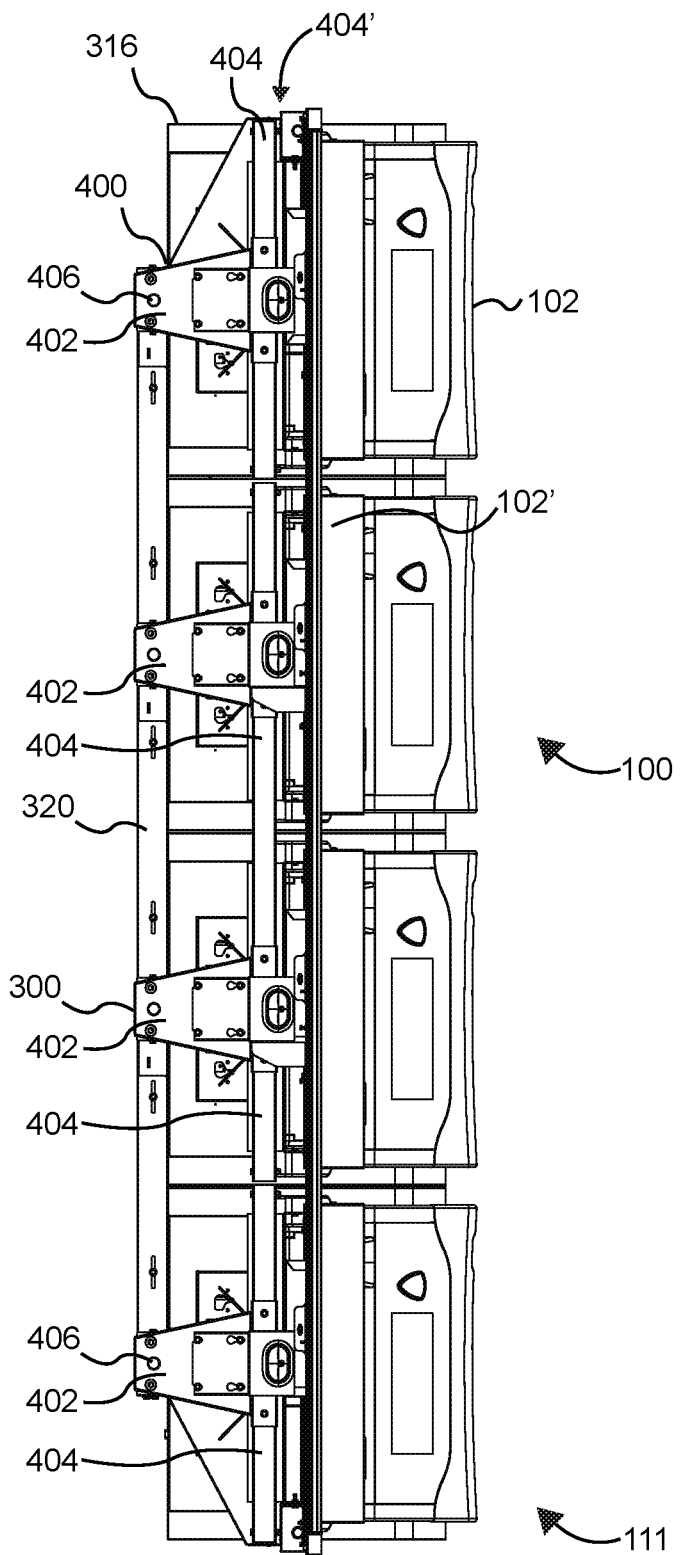

With further reference to FIGS. 4-6, each mounting assembly 200 includes a base 308, a support stanchion 300, a track mechanism 400, and a monitor frame 106. The support stanchion 300 extends generally vertically and has a lower end 302 connected to the base 308 and an upper end 304 connected to the track mechanism 400. The monitor frame 106 is configured to affix to a display monitor 104. For example, the monitor frame 106 may be screwed directly a pre-configured mounting location (not shown) on the back of the display monitor 104. The monitor frame 106 further includes at least one roller mechanism 500 that releasably mates to a track portion 404 of the track mechanism 400, as is explained in greater detail below. As is visible in FIG. 4, the four track portions 404 may line up to form a continuous track assembly 404'.

As can be seen in FIG. 5, for example, the base 308 may comprise an enlarged "L" bracket made of steel, aluminum, or a polymer, for example. The base 308 is configured to sit on floor surface 116 and/or be affixed to floor surface 116, e.g., by fasteners, such as bolts and/or screws. The base 308 may be configured to affix to a pedestal 112 of an EGM 102 in order to secure the overhead display assembly 100 relative to the EGM. In some embodiments, the pedestal and EGM are positioned on top of the base 308 (and specifically the lower plate of the base).

In some embodiments, the weight of the pedestal 112 and gaming machine 102 may exceed the weight of the overhead display assembly 100. Thus, the pedestal 112 and EGM 102 may act as an anchor securing the overhead display assembly 100 affixed to the base 308. In some applications, the support stanchion 300 may further be secured to a vertical wall (not shown) by fasteners (not shown) such as bolts and or screws that extend through the support stanchion 300 and into the wall, for example. Alternatively, the base 308 may be fastened to the floor.

Figure 2:
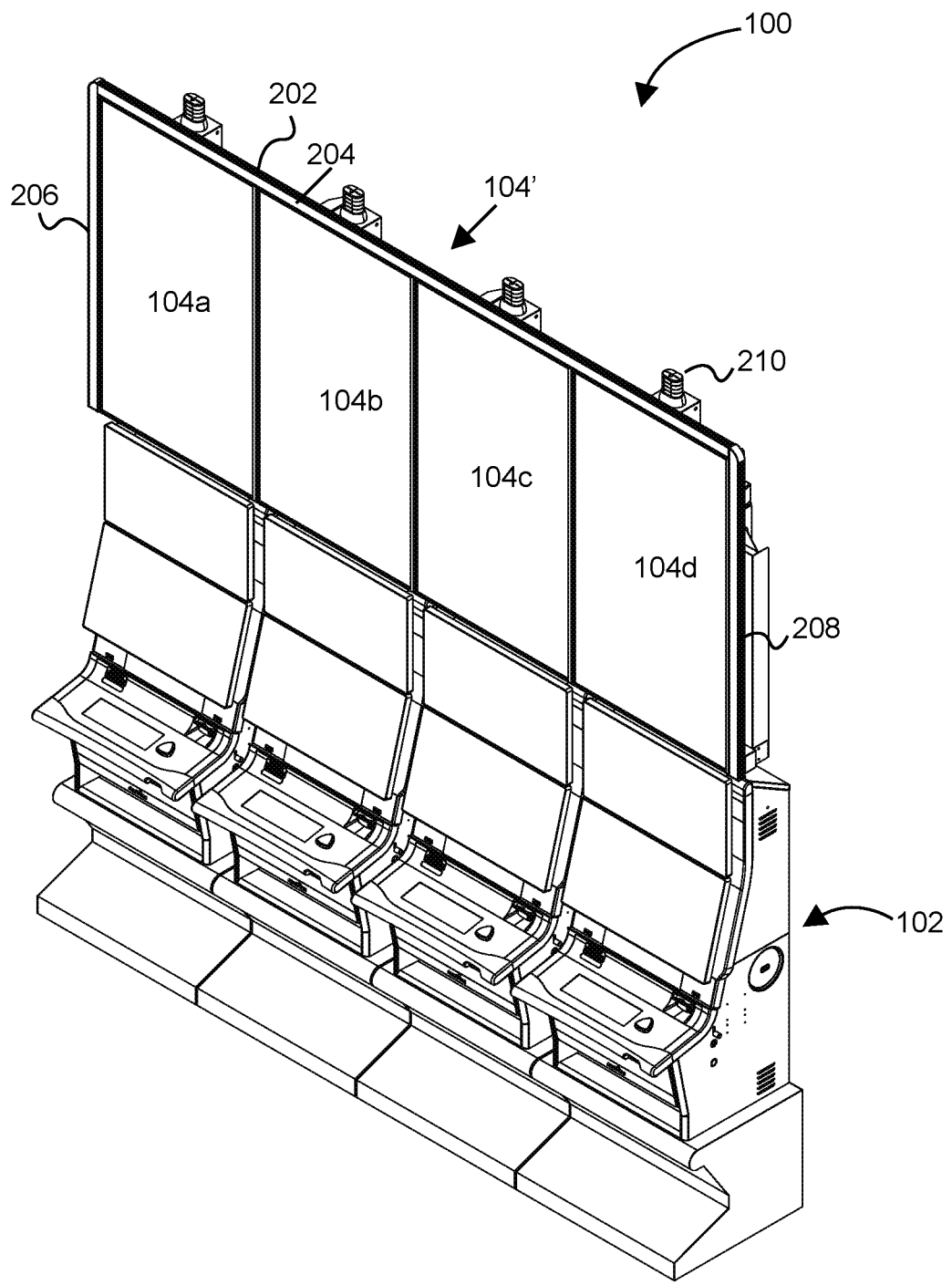
Figure 3:
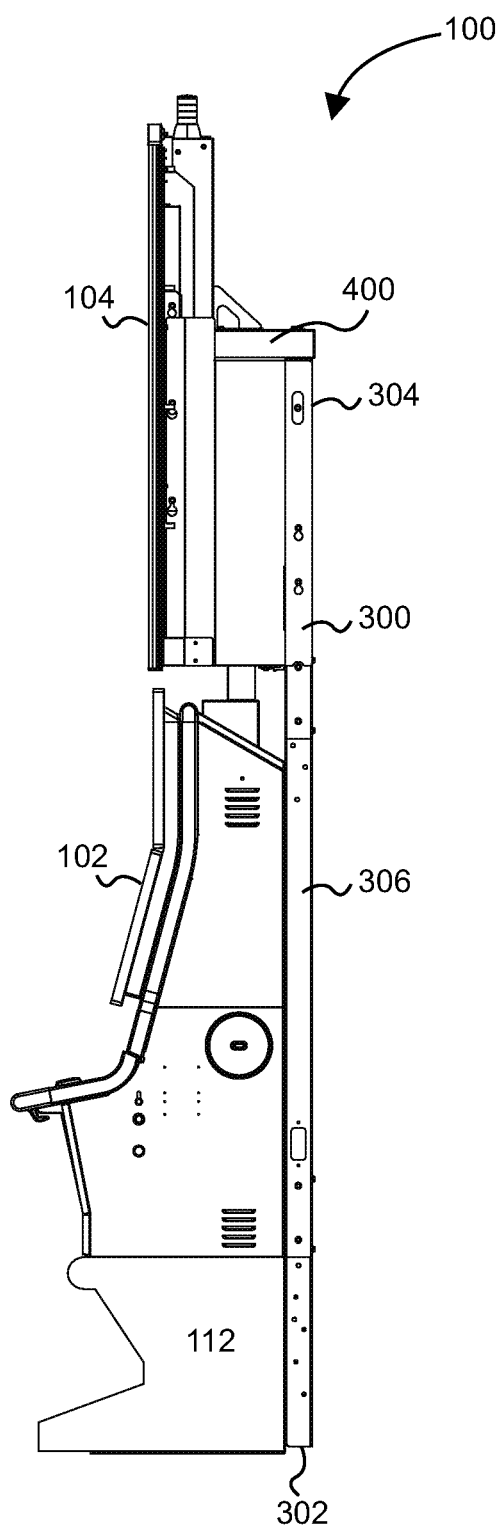

As shown in FIG. 2, for example, the overhead display assembly 100 may include a linear fixture 202 extending across an edge (i.e., the upper edge, of each of the plurality displays 104 of combined display monitor 104'). The linear fixture 202 may be affixed to the mounting assembly 200. In some embodiments, linear fixture 202 includes an attraction lighting device 204. The overhead display assembly 100 may also include a left-side attraction lighting device 206. The left-side attraction lighting device 206 may be affixed directly or indirectly to the left-most display monitor 104d. Alternatively, the left-side attraction lighting device 206 may be affixed to the left-most support stanchion 300d. The overhead display assembly 100 may also include a right-side attraction lighting device 208. The right-side attraction lighting device 208 may be affixed directly or indirectly to the right-most display monitor 104a. Alternatively, the right-side attraction lighting device may be affixed to the right-most support stanchion 300a. In some embodiments, the upper attraction lighting device 204 may be mounted above the track mechanisms 400 to be visible once display monitors 104 are attached. The attraction lighting device 204 may be mounted using one or more fixture brackets 205 (shown in FIG. 5). The fixture brackets may be affixed to an upper surface of one or more track mechanisms 400.

The overhead display assembly 100 may also include one or more alert lights 210. The alert lights 210 may correspond to a particular gaming machine 102. The alert lights may be affixed directly or indirectly to the display monitors 104. Alternatively, the alert lights 210 may be affixed directly or indirectly to support stanchion 300. The alert lights 210 may indicate, for example, if the EGM 102 is having technical issues or if an award has been won on the corresponding EGM 102.

As can be seen in FIGS. 5 and 6, for example, the support frames 201 may be connected (or ganged) together to form an integral assembly. For example, in some embodiments, the support frames 201 may be linked together by an upper linking structure 320 that extends between adjacent support stanchions 300 proximate their upper ends 204. An example upper linking structure 320 may include two L-brackets 320a configured to be affixed to the adjacent two support stanchions 300. The two L-brackets may be joined by affixing a U bracket 320b to the floating end of both L-brackets. Additionally, in some embodiments, the support frames 201 may be interconnected by together by lower linking structures 322 that extend between the bases 308 of adjacent support racks. The lower linking structures may also be affixed to the support stanchions 300 proximate their lower ends 302. An example lower linking structure 322 may include a rectangular plate 322a made of a rigid material such as metal. The upper, left, and right sides of the plate may have extruded arms (not shown) forming an upside-down "U" shaped bracket. The left and right side extruded arms may be affixed to the two adjacent support stanchions 300. The plate may be affixed to the rear of the base 308 of each support stanchion 300.

FIG. 6 additionally shows a rear elevation view of a portion of the overhead display assembly 100 according to the embodiment shown in FIG. 5. Specifically shown are the support stanchions 300 and track mechanisms 400 with engaged display monitors 104. FIG. 6 shows an example embodiment comprising four support stanchions 300 with coinciding four track mechanisms 400 and four engaged display monitors 104. As discussed above, the track portions 404 of the four track mechanisms 400 may combine to form a continuous track assembly 404'. In one embodiment each of the four display monitors 104 are engaged with the track mechanism 400. Each of the four display monitors 104 abuts the adjacent display monitor 104. Moreover, each of the four display monitors 104 are horizontally aligned to give the impression of a single cohesive display monitor 104'.

Figure 7:
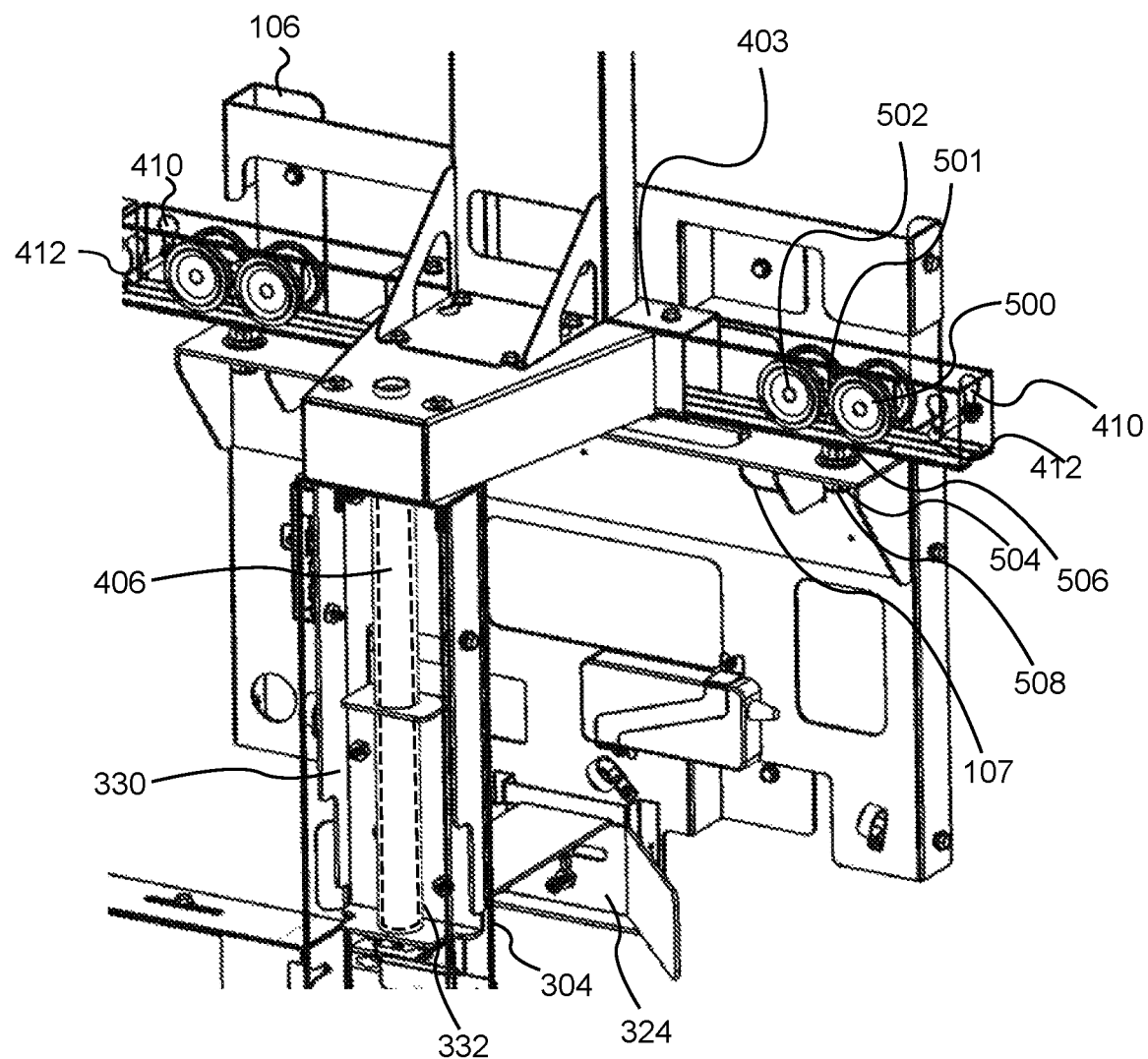
Figure 8:
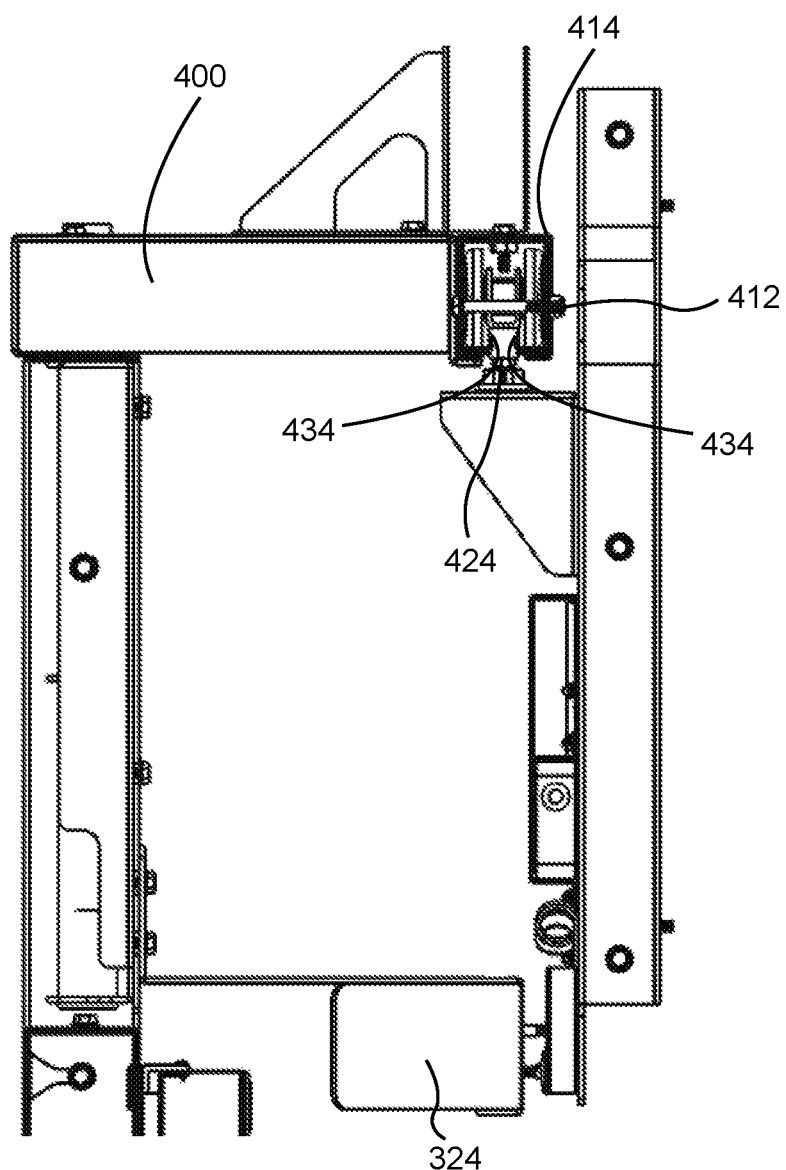
Figure 9:
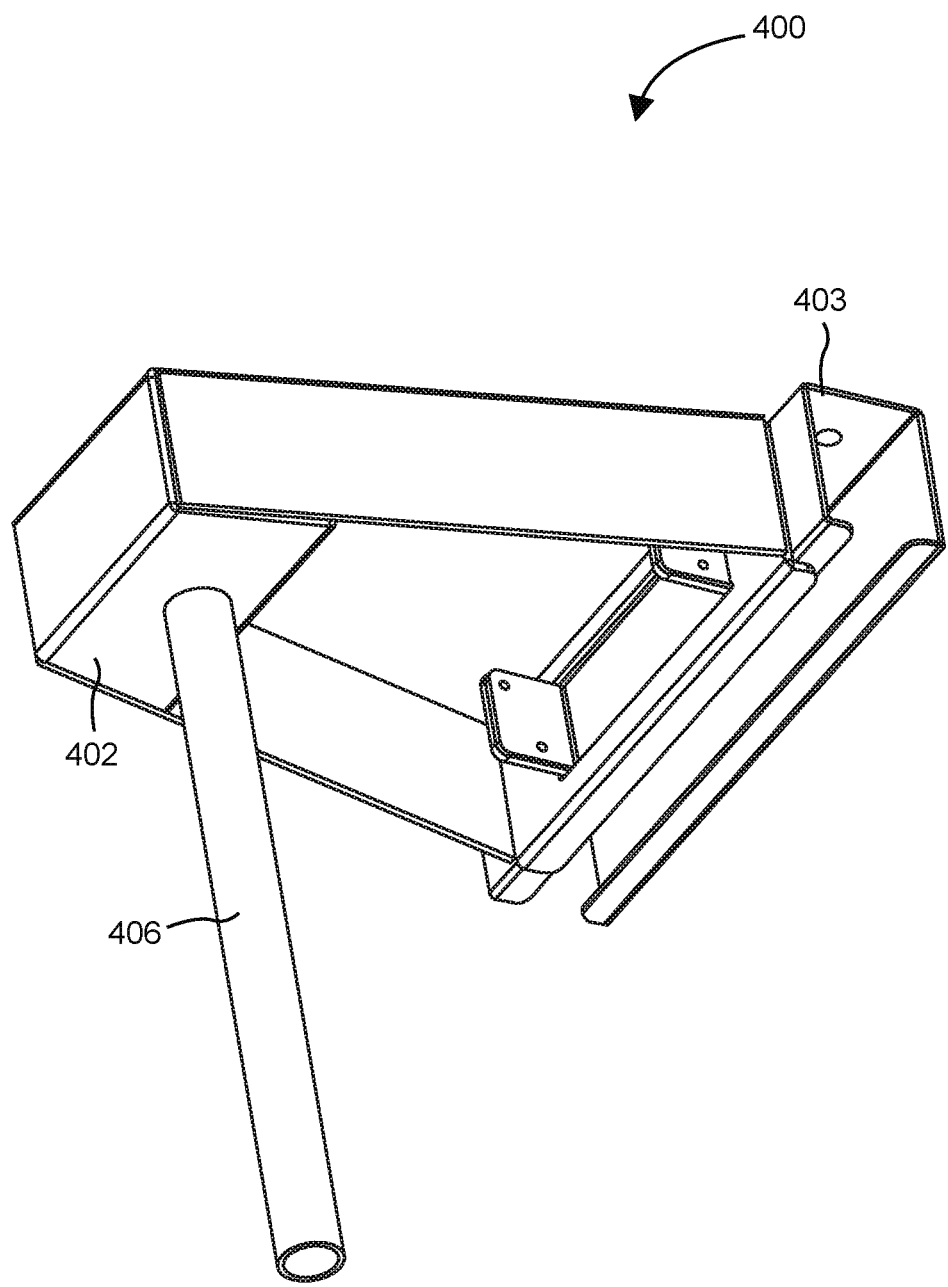

As can be seen in FIGS. 7-9, the track mechanism may comprise a coupling portion 402 and a track portion 404. The track portion 404 may be horizontally offset from the coupling portion 402. The offset may correspond to the distance between the support stanchion 300 and a display 102' of gaming machines 102. The coupling portion 402 may further comprise a pivoting member 406 (shown in dashed lines in FIG. 7). In some embodiments, only the outer (i.e., left-most and right-most) track mechanisms 400 may include the pivoting member 406. In other embodiments, every track mechanism 400 includes a pivoting member 406. The track portion 404 of track mechanism 400 may be configured to engage with one of more roller mechanisms 500. The terms "engage" or "engaged" may mean inserting one or more roller mechanisms 500 into an open end of track portion 404.

As shown in FIGS. 7 and 8, for example, in some embodiments, a locking member 324 may be affixed to the support stanchion 300 proximate its upper end 304. Once display monitors 104 are engaged to the track portion 404 of track mechanism 400 and placed in the operational position α, the display monitor 104 may be locked into place by affixing the monitor frame 106 to the exposed end of the locking member 324. The locking member 324, monitor frame 106, and/or support stanchion may include one or more apertures (not shown) configured to receive a fastener such as a screw or bolt. In one example embodiment, the locking member 324 is affixed with bolts to both the support stanchion 300 and monitor frame 106. Thus, in the example embodiment, the locking member 324 acts as a brace between the monitor frame 106 and support stanchion 300 preventing movement of the monitor frame 106 (on coincidentally display monitor 104) and providing extra rigidity to the entire support frame 201.

As can be seen in FIG. 9, the pivoting member 406 of track mechanism 400 may be a tube projecting downward from the coupling portion 402. The pivoting member 406 may be configured to be inserted into the upper end of support stanchion 300 (i.e., coupled). The track mechanism may further include a brace portion 403 configured to affix to the track portion 404 (not shown in FIG. 9).

As can be seen in FIG. 7, for example, in at least some embodiments the track mechanism may be pivotally coupled to the upper end 304 of the support station 300. The term "pivotally coupled" may refer to allowing rotation about a single axis (i.e., one rotational degree of freedom) while the part is secured on all other axes and rotational axes (i.e., the three linear degree of freedom and two remaining rotational degree of freedom). For example, pivotally coupled could mean permitting rotation about the Z axis, but restricting linear movement along the X, Y, Z axes and restricting rotation about the Y and Z axes.

Specifically, FIG. 7 shows an example rear perspective close-up cut-away view of the track mechanism 400, monitor frame 106, and the upper end 304 of support stanchion 300. In some embodiments, the upper end 304 of support stanchion 300 may include a receiver 330. The receiver 330 may be a shaped frame made of metal or a suitable polymer and be affixed to the interior of the support stanchion 300 proximate the upper end 304. The receiver 330 may comprise a receiving member 332, which may, for example be in the form of receiving tube having an open end at the top and a sealed end at the bottom. Thus, the open end of the receiving member 332 is configured to receive the pivoting member 406 of track mechanism 400. Once the pivoting member 406 is inserted into the receiving member 332, the entire the track mechanism 400 may be able to rotate, via "tube-in-tube" configuration—the pivoting member 406 inside of receiving member 332—about the stationary support stanchion 300 (i.e., pivotally coupled). Either or both of the pivoting member 406 and/or receiving member 332 may be made of a material to reduce friction between the two components to ensure that the pivoting member 406 is able to rotate freely when inserted into the receiving member 332.

The receiver 330 and/or receiving member 332 may be vertically adjustable. For example, one or more tube shims (not shown) may be inserted into the receiving member 332 to lower or extend the pivoting member 406 when it is pivotally coupled. Thus, by vertically adjusting the receiving member 332 and pivoting member 406, one is able to adjust the height of the track mechanism 400 and thereby the display monitor 104. As shown in FIG. 7, some embodiments may include one or more roller mechanism(s) 500. The roller mechanism 500 may be a traditional trolley wheel or caster known in the art and available at common retailers. For example, in one embodiment, there may be two roller mechanisms 500 pivotally coupled to an extruded shelf 107 of monitor frame 106. In such an embodiment, either of the two roller mechanisms 500, when pivotally coupled to the track portion 404 is able to support at least the entire weight of the display monitor 104, monitor frame 106, and rollers 500. The roller mechanisms 500 may be located proximate both ends of the extruded shelf 107 of monitor frame 106. The roller mechanism 500 may comprise a frame 501, at least one wheel 502, a stem 504, and a roller pivoting member 506. The roller pivoting member 506 may comprise a standard bearing assembly known in the art. In one embodiment, there may be four wheels 502 pivotally coupled to frame 501. The roller pivoting member 506 may be affixed to the frame 501. The stem 504 may be affixed to the roller pivoting member 506 and be able to rotate about the frame 501 and wheel(s) 502 via the roller pivoting member 506. The stem 504 may be threaded.

The roller mechanism 500 may be affixed to the extruded shelf 107 via two nuts 508. In one embodiment this is done by inserting the stem 504 into an aperture in the extruded shelf (not shown) and effectively pinching the extruded shelf 107 between the two nuts 508 that are threaded on the stem 504. Nuts 508 may be locking nuts preventing movement of the shelf 107 once attached. When affixed to the extruded shelf 107 via nuts 508, the roller mechanism 500 may be oriented to have the wheels 502 facing upwards. In one embodiment, the roller mechanism 500 is vertically adjustable by repositioning nuts 508 along the stem 504. For example, the nuts 508 can be raised or lowered on the threaded stem 504, thus raising or lowering the roller mechanism 500 with respect to the shelf 107 of monitor frame 106. The repositioning of roller mechanism 500 with respect to shelf 107 in turn may raise or lower the display monitor 104 when the display monitor 104 is engaged to the track mechanism 400 via the roller mechanism 500.

Additionally, in the embodiment comprising two roller mechanisms 500, the angle of the display monitor 104 may be adjusted (i.e., aligned with adjacent display monitors 104) by adjusting one or both sets of nuts 508. For example, when the display monitor 104 is engaged to the track mechanism 400 via the two roller mechanisms 500, by raising the nuts 508 on the stem 504 of the left roller mechanism 500 and lowering the nuts 508 on the stem 504 of the right roller mechanism 500 (or vice versa) one is able alter the angular positioning of shelf 107 with respect to the fixed track portion 400. Thus, in turn, because the shelf 107 is an integral part of monitor frame 106 and because the display monitor 104 is affixed to the monitor frame 106, the angular position display monitor 104 is also adjusted.

As shown in FIGS. 7 and 8, the track portion 404 may comprise a track frame 414. The track frame 104 may be affixed directly to a brace portion 403 of the track mechanism 400. The track frame 414 may be generally an enclosed rectangular hollow tube sized to allow the wheels 502 of roller mechanism 500 to be inserted at either end. The track frame 414 may, for example, be formed of metal or a suitable polymer and may be rigid enough to withstand the weight of at least the display monitor 104, monitor frame 106, and roller mechanism 500. For example in one embodiment a typical garage door track may be used for the track frame 414.

The track portion 104 may further comprise a slot 424 configured to accommodate the stem 504. Finally, the track portion 104 may include two raised ledges 434 on either side of slot 424 and projecting inwards, configured to prevent the wheels 502 from slipping off or out of the track portion 104. Additionally, the track portion may include one or more stop mechanisms that may include two sets of apertures 410 cut through both sides of track frame 414 and positioned proximate both ends of track frame 414. Apertures 410 may be configured to receive a pin 412. One embodiment may include pins 412 inserted into both sets of apertures 410 proximate both ends of track frame 414. In such an embodiment, pins 412 may hinder the movement of the roller mechanisms 500 once the roller mechanisms are inserted into the track portion 104.

Figure 10:
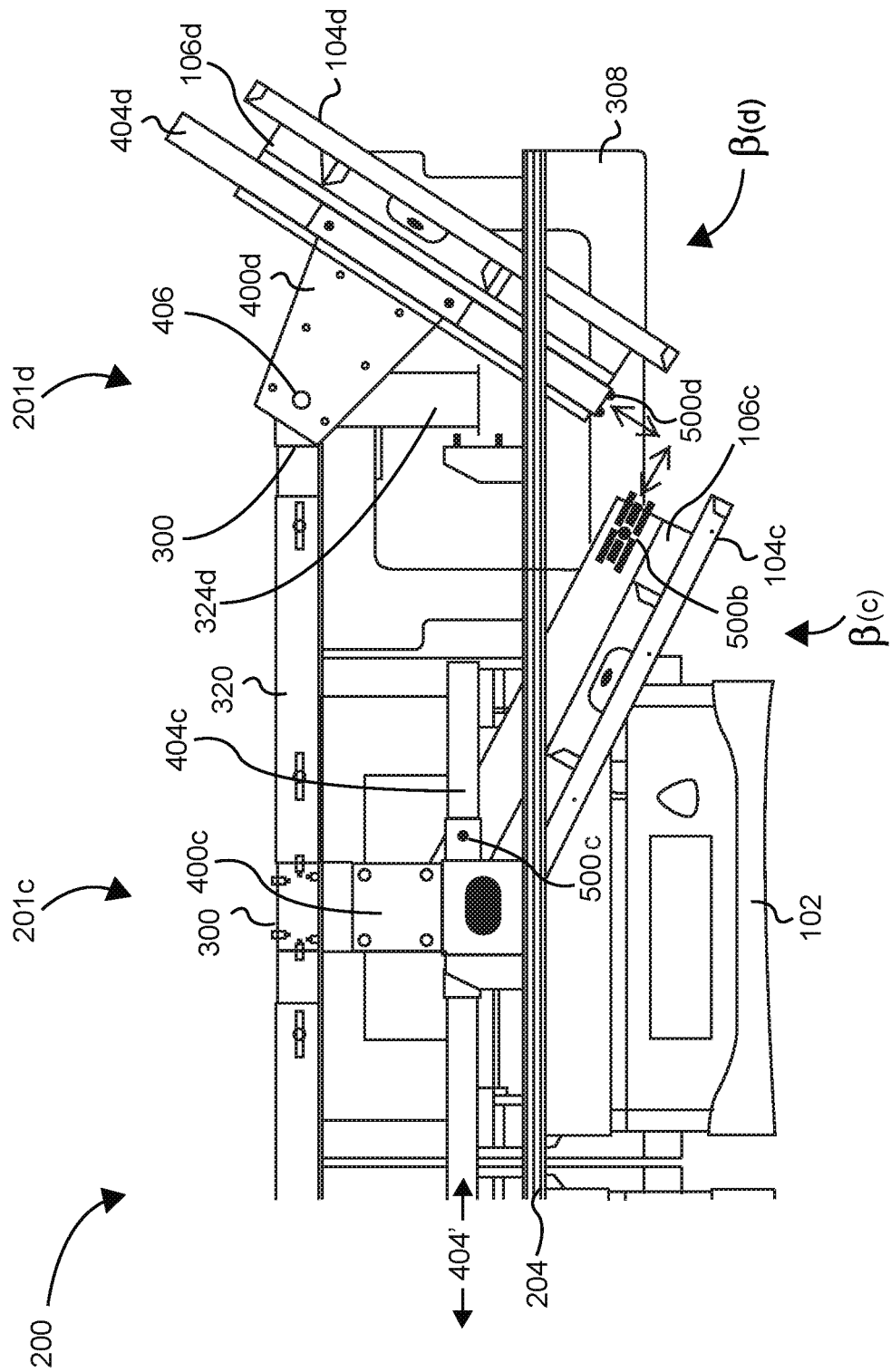
Figure 11:
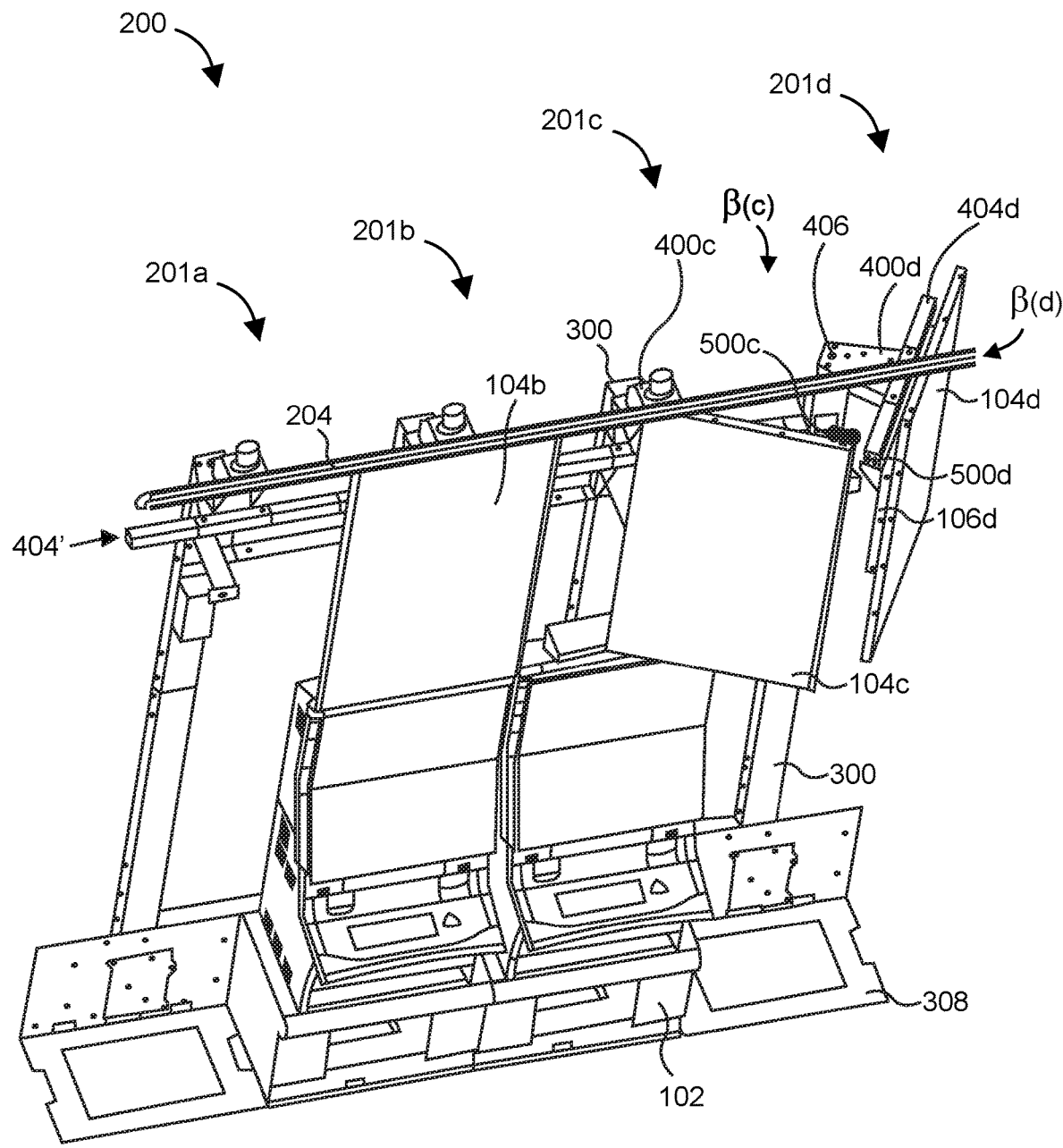

FIG. 10 shows an example partial top plan view of an overhead display assembly 100 and FIG. 11 shows an example partial front perspective view of right-most display monitor 104d and one of the central display monitors 104c in respective maintenance positions β(c) and β(d) displaced form the operational position α. For clarity of illustration, in FIG. 9 display monitors 104a and 104b as well as coinciding parts of support frames 201a and 201b have been omitted from FIG. 9. As in the example embodiments described above, only the outer track mechanism 400a includes a pivoting member 406. The inner track mechanism 400b does not including a pivoting member 406 and is affixed directly to support stanchion 300 (i.e., not permitting any rotation). In an example embodiment, once monitor frame 106a is disconnected from locking member 324a, the display monitor 104a, monitor frame 106a, and track mechanism 400a are collectively able to rotate into the maintenance position β(d) via the pivoting member about support stanchion 300. For example, in order to remove monitor 106d, track mechanism 400d is rotated counter clock-wise to expose the open end of track portion 404d. Once pin 412 is removed from the exposed track portion 404d, the display monitor 104a can be removed by rolling the display monitor 104d down the track portion 404d via the roller mechanisms 500d (i.e., disengaging).

In such an embodiment, once the outer display monitor 104d is rotated into a maintenance position β(d), inner display monitor 104c can be accessed for maintenance. For example, in some embodiments, display monitor 104c may be partially pushed out of track portion 404c (i.e., partially disengaged). In such an embodiment, one of the two roller mechanisms 500c is no longer seated in the track portion 404c. The second of the two roller mechanisms 500c is however, still seated within the track portion 404c allowing display monitor 104c to rotated clockwise, via the roller pivoting member 506c, about the second seated roller mechanism 500c. In such an embodiment, display monitor 104c may be moved and/or rotated into a maintenance position β(c) to access the rear or sides of display monitor 104c. Alternatively display monitor 104c may move removed and replaced entirely by rolling both of roller mechanism 500c out of track portion 404c.

Likewise, the present disclosure enables for an efficient installation of multiple display monitors 104 in space limited locations. For example, in the embodiment shown in FIG. 8, the left side of the overhead display assembly 100 may be position against a wall making it difficult or impossible to install any display monitors 104 near the wall. As was described in the embodiment above, the track portions 404 of each of the track mechanisms may align to form a continuous track assembly 404'. Any number of track mechanisms 400 is possible in such an embodiment. In the example having a total of four track mechanisms 400, three of the four coinciding display monitors 104 may be magazine fed into the track assembly 404'. The term "magazine fed" may refer to being inserted or engaged with the track portion sequentially (e.g., one after another).

In such an embodiment, once the right-most track mechanism 400d is rotated into a maintenance position β(d), each of the three remaining display monitors 104 can be engaged to the track mechanism 400 by inserting the roller mechanism(s) 500 into the exposed end of track portion 404c. Once the first of the three display monitors 104 is engaged, it can be rolled down to the left-most position via the roller mechanism(s) 500 along track assembly 404'. Likewise, once the second display monitor 104 is engaged to the track mechanism, it can be rolled along the track assembly 404' via its roller mechanism(s) until it abuts the first (i.e., left-most) display monitor 104. Finally, the third display monitor 104 may be engaged to exposed end of track portion 404b and rolled along the track assembly 404' via its roller mechanism(s) 500 until it abuts the second display monitor 104.

Figure 12:
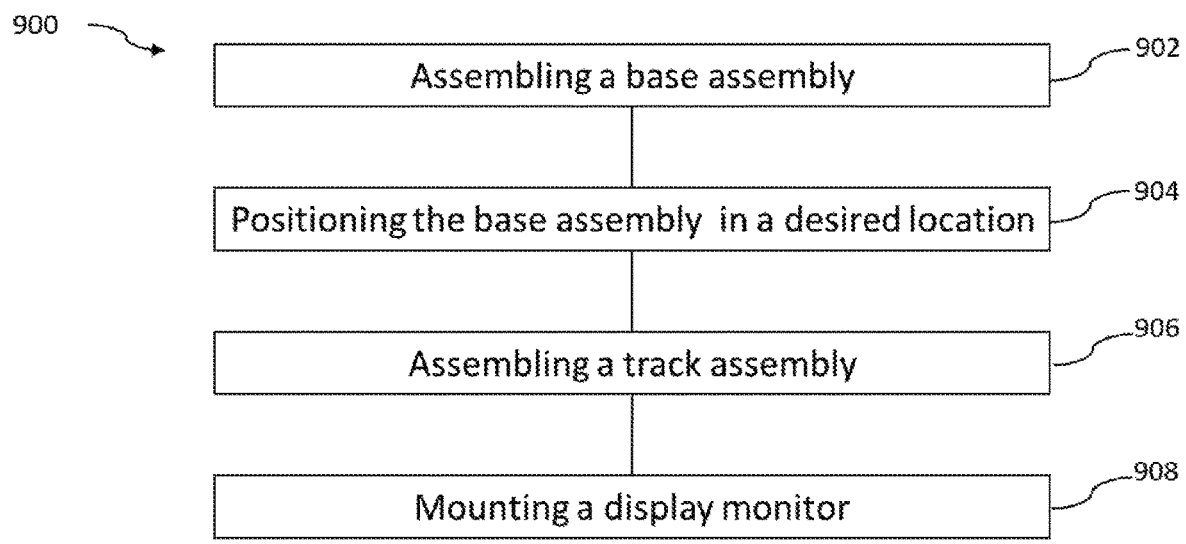

FIG. 12 is a flowchart of a method 900 of assembling an overhead display assembly 100 for an electronic machine 102 wherein the overhead display assembly includes a monitor frame 106 securable to a display monitor 104, the monitor frame 106 including at least one roller mechanism 500 that is pivotally coupled to the monitor frame 106. In the example embodiment, method 900 includes assembling a base assembly 902, comprising: affixing a pedestal 112 of an EGM 102 to a base 308; affixing a support stanchion 300 to the base 308, the support stanchion 300 comprising a lower end 302, and an upper end 304, the lower end 302 configured to couple to the base 308. The method may include positioning the base assembly in a desired location 904. The method may also include assembling a track assembly 906, comprising: coupling a track mechanism 400 to the upper end 304 of the support stanchion 300; and aligning the track mechanism 400. The method may also include mounting a display monitor 908, comprising: engaging the display monitor 104 via the at least one roller mechanism 500 to the track assembly; and locking the display monitor 104 to the support stanchion 300 with a locking member 324.

Optionally, method 900 further includes a plurality of gaming machines 102 and a plurality of display monitors 104, the method further comprising aligning the plurality of display monitors 104 by vertically adjusting the upper end 304 of each support stanchion and vertically adjusting the at least one roller mechanism 500 of each monitor frame 106. The method 900 may also optionally include an overhead display assembly that includes at least three gaming machines 102 and at least three display monitors 104 comprising a left-most support stanchion 300, a right-most support stanchion 300, and at least one central support stanchion 300, and wherein: the track mechanism 400 coupled to the left-most support stanchion 300 is pivotally coupled to the left-most support stanchion 300; and the track mechanism 400 coupled to the right-most support stanchion 300 is pivotally coupled to the right-most support stanchion 300; the method further comprising rotating at least one of the track mechanisms 400 of either the left-most support stanchion 300 or the right-most support stanchion 300 to gain access to the track mechanism 400 of the at least one central support stanchion 300.

It will be appreciated that the above embodiments that have been described in particular detail are merely example or possible embodiments, and that there are many other combinations, additions, or alternatives that may be included.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

While the disclosure has been described in terms of various specific embodiments, it will be recognized that the disclosure can be practiced with modification within the spirit and scope of the claims.

The above-described embodiments of overhead display assemblies that incorporate track and roller mechanisms provide a cost-effective and reliable means for safely accessing a component that is elevated above a floor surface for maintenance activities. More specifically, the methods and systems described herein facilitate translating a display monitor from a fixed operational position to a displaced maintenance position using minimal manual effort.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of assembling an overhead display assembly for an electronic gaming machine wherein the overhead display assembly includes a monitor frame securable to a display monitor, the monitor frame including at least one roller mechanism that is pivotally coupled to the monitor frame:

assembling a base assembly, comprising:
  affixing a pedestal of the electronic gaming machine to a base; and
  affixing a support stanchion to the base, the support stanchion comprising
a lower end and an upper end, the base configured to couple to the pedestal;
positioning the base assembly in a desired location;
assembling a track assembly, comprising:
  pivotally coupling a track mechanism to the upper end of the support stanchion by inserting a pivoting member extending from the track mechanism into a receiving member positioned at the upper end of the support stanchion, such that the track mechanism is rotatable about the support stanchion; and
  vertically aligning the track mechanism;

mounting the display monitor, comprising:

rotating the track mechanism into a maintenance position;

engaging the display monitor with the track mechanism by inserting the at least one roller mechanism in to the track mechanism;

rotating the track mechanism into an operational position; and locking the display monitor the support stanchion with a locking member to prevent rotation of the track mechanism.

2. The method of assembling an overhead display assembly for an electronic gaming machine of claim 1, wherein the overhead display assembly includes a plurality of base assemblies, a plurality of gaming machines, a plurality of display monitors, and a plurality of monitor frames, the method further comprising aligning the plurality of display monitors by vertically adjusting the upper end of the support stanchion of each of the plurality of base assemblies and vertically adjusting the at least one roller mechanism of each of the plurality of monitor frames.

3. The method of assembling an overhead display assembly for an electronic gaming machine of claim 2, wherein the overhead display assembly includes at least three gaming machines and at least three display monitors comprising a left-most support stanchion, a right-most support stanchion, and at least one central support stanchion, and wherein:

the track mechanism coupled to the left-most support stanchion is pivotally coupled to the left-most support stanchion; and the track mechanism coupled to the right-most support stanchion is pivotally coupled to the right-most support stanchion; and the method further comprising rotating the track mechanism of at least one of either the left-most support stanchion or the right-most support stanchion to gain access to the track mechanism of the at least one central support stanchion.

\* \* \* \* \*